(12) United States Patent
Hayashi et al.

(10) Patent No.: US 12,512,811 B2
(45) Date of Patent: Dec. 30, 2025

(54) ACOUSTIC WAVE DEVICE

(71) Applicant: Murata Manufacturing Co., Ltd., Nagaokakyo (JP)

(72) Inventors: Yasunobu Hayashi, Nagaokakyo (JP); Sunao Yamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 213 days.

(21) Appl. No.: 18/125,156

(22) Filed: Mar. 23, 2023

(65) Prior Publication Data

US 2023/0223916 A1 Jul. 13, 2023

Related U.S. Application Data

(63) Continuation of application No. PCT/JP2021/036793, filed on Oct. 5, 2021.

(30) Foreign Application Priority Data

Oct. 9, 2020 (JP) .................................. 2020-171184

(51) Int. Cl.
H03H 9/02 (2006.01)

(52) U.S. Cl.
CPC .... *H03H 9/02574* (2013.01); *H03H 9/02818* (2013.01)

(58) Field of Classification Search
CPC .. H03H 9/02574; H03H 9/02818; H03H 3/08; H03H 9/02614; H03H 9/059; H03H 9/1092
USPC .......................... 333/133, 186–188, 193–196
See application file for complete search history.

(56) References Cited

U.S. PATENT DOCUMENTS

| | | |
|---|---|---|
| 2016/0294354 A1 | 10/2016 | Saijo et al. |
| 2018/0102757 A1 | 4/2018 | Fukushima et al. |
| 2019/0007023 A1 | 1/2019 | Yen |
| 2020/0195219 A1 | 6/2020 | Yamamoto et al. |
| 2020/0204151 A1 * | 6/2020 | Yen ..................... H03H 9/02677 |

FOREIGN PATENT DOCUMENTS

| | | |
|---|---|---|
| CN | 107615658 A | 1/2018 |
| CN | 111066244 A | 4/2020 |
| WO | 2015098679 A1 | 7/2015 |
| WO | 2016208426 A1 | 12/2016 |
| WO | 2019044203 A1 | 3/2019 |

OTHER PUBLICATIONS

International Search Report in PCT/JP2021/036793, mailed Dec. 21, 2021, 3 pages.
Written Opinion in PCT/JP2021/036793, mailed Dec. 21, 2021, 4 pages.
Official Communication issued in corresponding Chinese Patent Application No. 202180066040.4, mailed on May 12, 2025, 8 pages.
Official Communication issued in corresponding Chinese Patent Application No. 202180066040.4, mailed on Sep. 9, 2025, 7 pages.

* cited by examiner

*Primary Examiner* — Jorge L Salazar, Jr.
(74) *Attorney, Agent, or Firm* — Keating & Bennett, LLP

(57) ABSTRACT

An acoustic wave device includes a support substrate, a piezoelectric layer on the support substrate, and a functional element on the piezoelectric layer. The support substrate and the piezoelectric layer each have a rectangular or substantially rectangular shape in plan view from a direction normal to the support substrate. At least one corner portion of the piezoelectric layer has a curved shape or a polygonal shape.

5 Claims, 4 Drawing Sheets

ACOUSTIC WAVE DEVICE

CROSS REFERENCE TO RELATED APPLICATIONS

This application claims the benefit of priority to Japanese Patent Application No. 2020-171184 filed on Oct. 9, 2020 and is a Continuation Application of PCT Application No. PCT/JP2021/036793 filed on Oct. 5, 2021. The entire contents of each application are hereby incorporated herein by reference.

BACKGROUND OF THE INVENTION

1. Field of the Invention

The present disclosure relates to an acoustic wave device and, more particularly, to techniques for reducing or preventing peeling of a piezoelectric layer in an acoustic wave device having a wafer level package (WLP) structure or a chip size package (CSP) structure.

2. Description of the Related Art

In recent years, communication devices such as mobile terminals typified by cellular phones and smart phones perform communication in which radio frequency signals in a plurality of frequency bands are used. When the signals in the plurality of frequency bands are processed, a filter for selectively passing a signal in each of the frequency bands is used.

As such a filter, for example, a filter has been known in which a surface acoustic wave (SAW) resonator is used. International Publication No. 2015/098679 discloses an acoustic wave device that has a WLP structure or a CSP structure and is used as a band-pass filter. In the acoustic wave device disclosed in International Publication No. 2015/098679, by adopting a configuration in which a piezoelectric thin film is not disposed underneath a pad electrode portion bonded to an external connection terminal, it is possible to prevent the piezoelectric thin film from being peeled off from a support substrate or cracked when the external connection terminal is bonded or when the acoustic wave device is mounted.

SUMMARY OF THE INVENTION

In the acoustic wave device as described above, when the acoustic wave device is mounted on a mounting substrate and a reflow or other thermal shock is applied, stress is generated due to a difference in a thermal expansion coefficient between the support substrate and a piezoelectric layer in a subsequent temperature decrease process, and the piezoelectric layer may be peeled off from the support substrate. In particular, there is a possibility that, depending on a planar shape of the piezoelectric layer, stress is concentrated at a corner portion of the piezoelectric layer and peeling is likely to occur.

Preferred embodiments of the present invention reduce or prevent peeling of a piezoelectric layer on a support substrate in an acoustic wave device having a WLP structure or a CSP structure.

An acoustic wave device according to a preferred embodiment of the present disclosure includes a support substrate, a piezoelectric layer on the support substrate, and a functional element on the piezoelectric layer. The support substrate and the piezoelectric layer each have a rectangular or substantially rectangular shape in plan view from a direction normal to the support substrate. At least one corner portion of the piezoelectric layer has a curved shape or a polygonal shape.

According to an acoustic wave device according to a preferred embodiment of the present disclosure, the corner portion of the rectangular or substantially rectangular piezoelectric layer on the support substrate has a curved shape or a polygonal shape. Thus, when a thermal stress is applied, stress concentration on the corner portion is alleviated. Thus, in the acoustic wave device, it is possible to reduce or prevent peeling of the piezoelectric layer disposed on the support substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
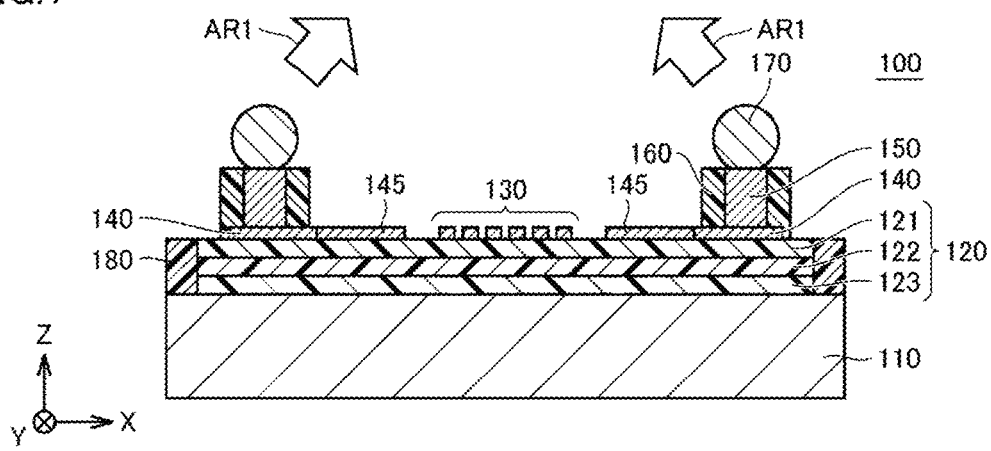
FIG. 1 is a sectional view of an acoustic wave device according to a preferred embodiment of the present invention.

Hereinafter, preferred embodiments of the present disclosure will be described in detail with reference to the drawings. Note that the same or corresponding parts in the drawings are denoted by the same reference numerals, and description thereof will not be repeated.

Configuration of Acoustic Wave Device

A detailed configuration of an acoustic wave device 100 according to a preferred embodiment will be described using FIG. 1 and FIG. 2. FIG. 2 is a plan view of the acoustic wave device 100, and FIG. 1 is a sectional view taken along line I-I in FIG. 2.

Figure 2:
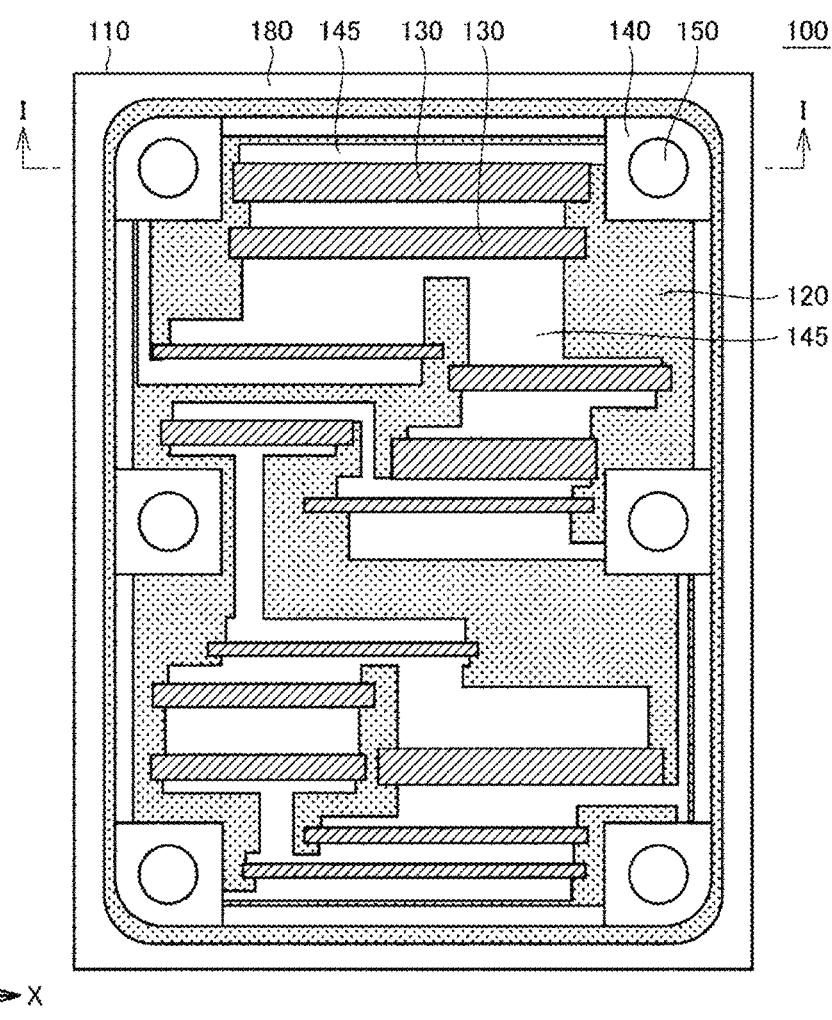
FIG. 2 is a plan view of the acoustic wave device of FIG. 1.

Referring to FIG. 1 and FIG. 2, the acoustic wave device 100 includes a support substrate 110, a laminated film 120, a functional element 130, an electrode pad 140, a wiring electrode 145, a support body 160, a connection electrode 150 provided inside the support body 160, a solder bump 170, and a resin layer 180. The laminated film 120 includes a piezoelectric layer 121, a low acoustic velocity layer 122, and a high acoustic velocity layer 123. In the following description, the low acoustic velocity layer 122 and the high acoustic velocity layer 123 are also collectively referred to as an "intermediate layer". Note that, in the following description, a positive direction of the Z-axis in a laminate direction in the drawings may be referred to as an upper surface side, and a negative direction may be referred to as a lower surface side.

The support substrate 110 is a semiconductor substrate formed of silicon (Si). The support substrate 110 has a rectangular or substantially rectangular shape in plan view from a normal direction (Z-axis direction). On the support substrate 110, the high acoustic velocity layer 123, the low acoustic velocity layer 122, and the piezoelectric layer 121 are laminated in order toward the positive direction of the Z-axis. Note that the material of the support substrate 110 is not limited to silicon and may be silicon carbide (SiC) or crystal.

The piezoelectric layer 121 is formed of, for example, a piezoelectric single crystal material such as lithium tantalate ($LiTaO_3$), lithium niobate ($LiNbO_3$), and crystal, or a piezoelectric laminated material made of $LiTaO_3$, $LiNbO_3$, or aluminum nitride (AlN).

A plurality of functional elements 130 are disposed on an upper surface (surface in the positive direction of the Z-axis) of the piezoelectric layer 121. The functional elements 130 include a pair of interdigital transducer (IDT) electrodes and a reflector including, for example, an electrode material such as a single metal including at least one of aluminum, copper, silver, gold, titanium, tungsten, platinum, chromium, nickel, and molybdenum or an alloy including the single metal as a main component. The piezoelectric layer 121 and the IDT electrode define a surface acoustic wave (SAW) resonator.

The low acoustic velocity layer 122 is formed of a material in which an acoustic velocity of a bulk wave propagating through the low acoustic velocity layer 122 is lower than an acoustic velocity of a bulk wave propagating through the piezoelectric layer 121. In the acoustic wave device 100, the low acoustic velocity layer 122 is formed of silicon oxide ($SiO_2$). However, the low acoustic velocity layer 122 is not limited to silicon oxide and may be formed of another dielectric material such as glass, silicon oxynitride, or tantalum oxide or a compound obtained by adding fluorine, carbon, boron, or the like to silicon oxide, for example.

Further, the high acoustic velocity layer 123 is formed of a material in which an acoustic velocity of a bulk wave propagating through the high acoustic velocity layer 123 is higher than an acoustic velocity of an acoustic wave propagating through the piezoelectric layer 121. In the acoustic wave device 100, the high acoustic velocity layer 123 is formed of silicon nitride (SiN). However, the high acoustic velocity layer 123 is not limited to silicon nitride and may be formed of a material such as aluminum nitride, aluminum oxide (alumina), silicon oxynitride, silicon carbide, diamond-like carbon (DLC), or diamond.

By adopting the configuration in which the low acoustic velocity layer 122 and the high acoustic velocity layer 123 are laminated underneath the piezoelectric layer 121, the low acoustic velocity layer 122 and the high acoustic velocity layer 123 function as a reflective layer (mirror layer) 120. That is, a surface acoustic wave having leaked in a direction from the piezoelectric layer 121 toward the support substrate 110 is reflected by the high acoustic velocity layer 123 due to a difference in propagating acoustic velocity and is confined inside the low acoustic velocity layer 122. As described above, since the loss of acoustic energy of the surface acoustic wave to be propagated is reduced by the intermediate layer, the surface acoustic wave can be efficiently propagated.

Note that, in FIG. 1, the example has been explained in which one low acoustic velocity layer 122 and one high acoustic velocity layer 123 is disposed as the intermediate layer, but the intermediate layer may have a configuration in which a plurality of low acoustic velocity layers 122 and a plurality of high acoustic velocity layers 123 are alternately disposed. In addition, the intermediate layer is not an essential configuration, and only the piezoelectric layer 121 may be included as the laminated film 120. Alternatively, one of the low acoustic velocity layer 122 and the high acoustic velocity layer 123 may be provided as the intermediate layer. When only the low acoustic velocity layer 122 is provided as the intermediate layer, the support substrate 110 functions as a high acoustic velocity layer.

The laminated film 120 including the piezoelectric layer 121 and the intermediate layer (the low acoustic velocity layer 122 and the high acoustic velocity layer 123) has a rectangular or substantially rectangular shape in plan view from the direction normal to the support substrate 110 (the Z-axis direction) and is disposed inside an outer periphery of the support substrate 110. On the support substrate 110, the resin layer 180 formed using a material such as polyimide, polybenzoxazole (PBC)), benzocyclobutene (BCB), or epoxy, for example, is disposed on a portion where the laminated film 120 is not disposed (that is, around the laminated film 120). Note that the laminated film 120 does not necessarily have to be disposed inside the support substrate 110 and, as will be described later, may have the same external size as that of the support substrate 110 as long as a corner portion is not right-angled but has a curved shape.

A plurality of electrode pads 140 are disposed on a surface of the piezoelectric layer 121 on which the functional element 130 is disposed. The electrode pads 140 are disposed along a periphery of the support substrate 110 having a rectangular or substantially rectangular shape. Further, on the upper surface of the piezoelectric layer 121, the wiring electrode 145 is provided to electrically connect the functional elements 130 to each other and the functional element 130 to the electrode pad 140.

The connection electrode 150 is a columnar electrode protruding from the electrode pad 140 in the positive direction of the Z-axis. The connection electrode 150 electrically connects the solder bump 170 to the electrode pad 140. The acoustic wave device 100 is mounted on an external device by the solder bump 170.

The support body 160 has a wall shape structure surrounding the functional element 130 and protrudes from the upper surface of the piezoelectric layer 121 in the positive direction of the Z-axis. The support body 160 includes an insulating resin such as epoxy or polyimide and/or a photosensitive resin material. Part of the support body 160 covers the connection electrode 150. A space is formed around the functional element 130 by the support body 160.

In the acoustic wave device 100 in the present preferred embodiment, as illustrated in FIG. 2, a corner portion of the laminated film 120 is not right-angled but has a curved shape and, in the example of FIG. 2, has an arc shape having a predetermined radius of curvature (for example, about 25 μm to about 200 μm). Alternatively, the corner portion of the laminated film 120 may have a polygonal shape.

Figure 3A:
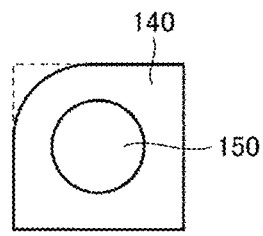
FIGS. 3A and 3B are diagrams for explaining a shape of a corner portion of an electrode pad.
Figure 3B:
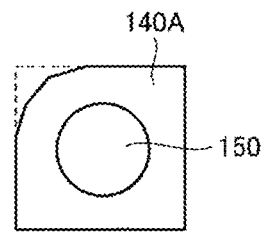

In addition, a shape of a portion of the electrode pad 140 facing the corner portion of the laminated film 120 also has an arc shape similar to the shape of the corner portion of the piezoelectric layer 121 (FIG. 3A). Alternatively, the shape of the corner portion of the electrode pad may be a polygonal shape as an electrode pad 140A illustrated in FIG. 3B.

As described above, the acoustic wave device 100 is mounted on an external device (mounting substrate) by the solder bump 170. At this time, in a reflow process of melting the solder bump 170, heat is applied to an entirety of the acoustic wave device 100, and temperature rises in the support substrate 110 and the laminated film 120.

Thereafter, the acoustic wave device 100 is cooled in order to solidify the solder bump 170, and stress is applied to the acoustic wave device 100 in the cooling process since thermal expansion coefficients of individual materials constituting the mounting substrate and the support substrate 110 differ. For example, when the mounting substrate is made of glass epoxy, the thermal expansion coefficient is approximately from $5 \times 10^{-5}$ to $15 \times 10^{-5}$ (1/K), whereas when the support substrate 110 is made of silicon, the thermal expansion coefficient is approximately from $2.5 \times 10^{-5}$ to $3 \times 10^{-5}$ (1/K). Accordingly, force is applied to the acoustic wave device 100 in a direction indicated by an arrow AR1 in FIG. 1.

Figure 4:
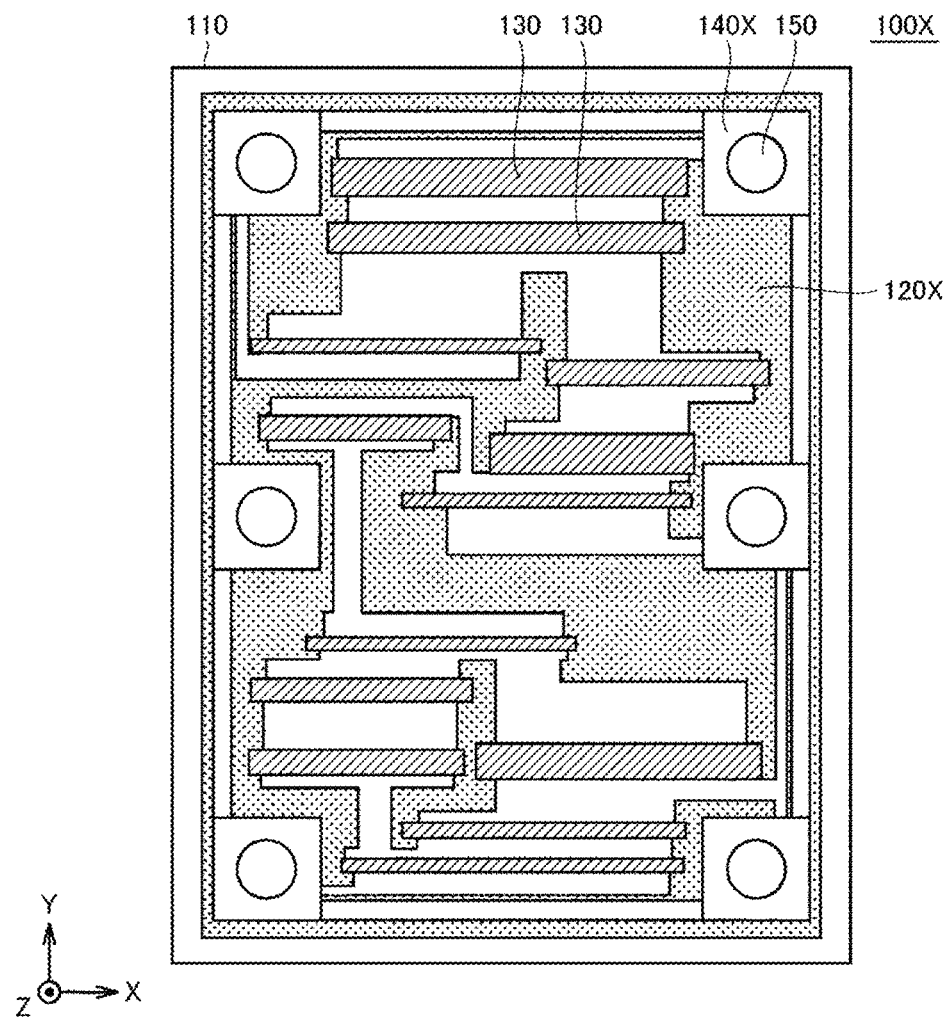
FIG. 4 is a plan view of an acoustic wave device according to a comparative example.

Then, stress may be generated between the support substrate 110 and the laminated film 120, between the respective layers disposed in the laminated film 120, and/or between the piezoelectric layer 121 and the electrode pad 140, and thus there is a possibility that peeling occurs between the respective elements. Here, as in an acoustic wave device 100X of a comparative example illustrated in FIG. 4, when a corner portion of each of a laminated film 120X and an electrode pad 140X is right-angled or has a shape close to a right angle, there is a tendency that stress is likely to concentrate on a vertex of the corner portion. Therefore, peeling is likely to occur from the corner portion of the laminated film 120X or the electrode pad 140X with the shape as in the comparative example.

On the other hand, in the acoustic wave device 100 of the present preferred embodiment, the corner portion of the laminated film 120 on the support substrate 110 and the portion of the electrode pad 140 facing the corner portion each have a curved shape (or a polygonal shape). With such a configuration, when a thermal stress such as a reflow is applied, stress concentration on the corner portion is alleviated, and thus it is possible to reduce or prevent peeling between the respective elements.

Note that it is also possible to form only the corner portion of the laminated film 120 in a curved shape and leave the corner portion of the electrode pad 140 right-angled, however, in this case, it is necessary to position the electrode pad 140 inside an outer edge portion of the laminated film 120, and an area of a region where the functional element 130 can be located is narrowed. By forming the portion of the electrode pad 140 facing the corner portion of the curved laminated film 120 in a curved shape, the electrode pad 140 can be disposed close to an end portion of the laminated film 120, so that it is possible to enlarge the region where the functional element 130 can be provided.

Manufacturing Process

Next, a manufacturing process of the acoustic wave device 100 of the present preferred embodiment will be described using FIGS. 5A to 5H. Note that, in FIGS. 5A to 5H, for ease of description, description will be given using a single acoustic wave device as a subject, but in practice, a plurality of acoustic wave devices are simultaneously formed on a single silicon wafer (support substrate 110) and the silicon wafer is divided into the individual acoustic wave devices by cutting with a dicing machine.

Figure 5:
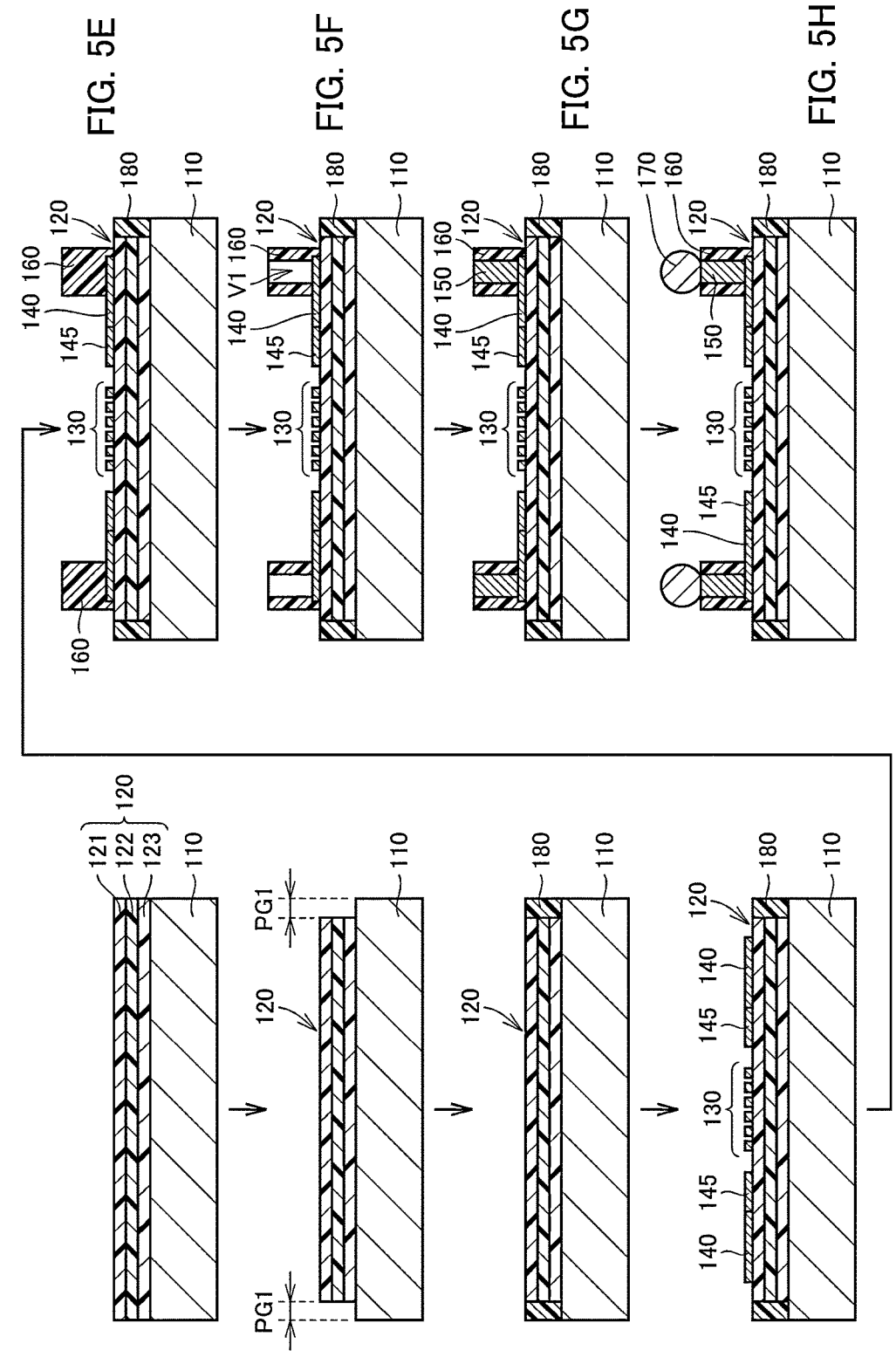
FIGS. 5A to 5H are diagrams for explaining a manufacturing process of the acoustic wave device of FIG. 1.

Referring to FIGS. 5A to 5H, first, in a process of FIG. 5A, the high acoustic velocity layer 123, the low acoustic velocity layer 122, and the piezoelectric layer 121 are laminated in order on the silicon support substrate 110 to form the laminated film 120. Thereafter, as in FIG. 5B, a portion (region PG1 in FIGS. 5A to 5H) of the laminated film between adjacent acoustic wave devices 120 is removed by etching. At this time, patterning is performed so that the corner portion of the laminated film 120 in each acoustic wave device has a curved shape or a polygonal shape as illustrated in FIG. 2.

Next, in a process of FIG. 5C, the resin layer 180 is disposed on the portion of the region PG1 where the laminated film 120 is removed. By disposing the resin layer 180 in the region, it is possible to reduce or prevent peeling and/or cracking at the end portion of the laminated film 120 when division into the individual acoustic wave devices by cutting with a dicing machine is performed.

When the disposition of the resin layer is completed, in a process of FIG. 5D, a conductive layer made of copper or the like is laminated on the piezoelectric layer 121, and the functional element 130, the electrode pad 140, and the wiring electrode 145 are disposed by patterning. At this time, as described with reference to FIG. 2 and FIGS. 3A and 3B, the portion of the electrode pad 140 facing the corner portion of the laminated film 120 has a curved shape or a polygonal shape.

Thereafter, in a process of FIG. 5E, the support body 160 is disposed so as to surround the functional element 130 and the electrode pad 140. Then, in FIG. 5F, a cavity V1 is formed in a portion of the support body 160 disposed on the electrode pad 140 using a laser or the like. The cavity V1 is formed to have such a depth that the electrode pad 140 is exposed.

After the cavity V1 is formed, in a process of FIG. 5G, the connection electrode 150 is formed by injecting a conductor made of Cu or the like into the cavity V1. Then, the solder bump 170 is disposed on the connection electrode 150 (FIG. 5H). Thereafter, a boundary portion (region PG1 in FIG. 5B) with an adjacent acoustic wave device is cut with a dicing machine to perform division into the individual acoustic wave devices.

As described above, in the processes of FIGS. 5B and 5D, by forming each of the corner portion of the laminated film 120 and the portion of the electrode pad 140 facing the corner portion in a curved shape or a polygonal shape, it is possible to reduce or prevent peeling of the laminated film 120 and the electrode pad 140 which may occur when a thermal stress is applied.

Modification 1

In the acoustic wave device 100 illustrated in FIG. 1, a space is formed around the functional element 130 by the support body 160, and the space is formed not to be isolated from the outside of the device in a portion where the solder bump 170 is not present. Thus, a change in a surrounding environment (for example, humidity, a corrosive gas, or the like) of the acoustic wave device 100 may affect the functional element 130.

In Modification 1, a configuration will be described in which a cover portion is provided on the support body 160 so that the functional element 130 is disposed in a space isolated from the outside of the device to reduce the influence of the change in the surrounding environment.

Figure 6:
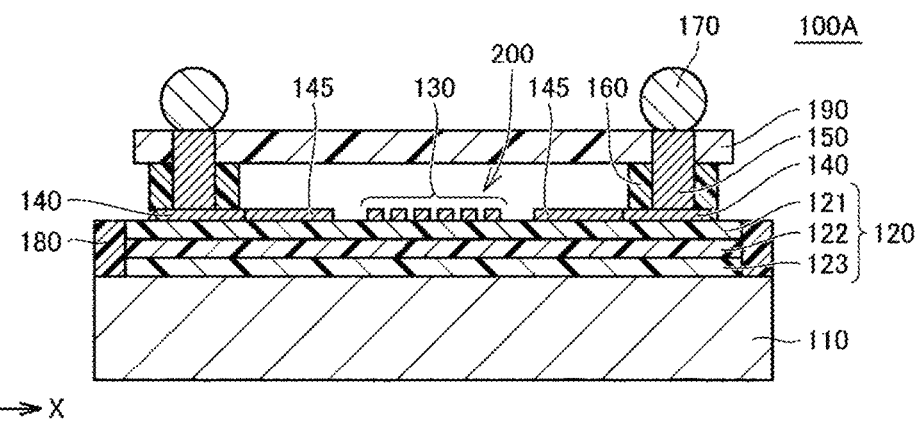
FIG. 6 is a sectional view of an acoustic wave device of Modification 1.

FIG. 6 is a sectional view of an acoustic wave device 100A of Modification 1. The acoustic wave device 100A of FIG. 6 has a configuration in which a cover portion 190 is added to the configuration of the acoustic wave device 100 of FIG. 1. In the description of FIG. 6, the description of elements redundant with FIG. 1 will not be repeated.

Referring to FIG. 6, in the acoustic wave device 100A, the cover portion 190 covering the functional element 130 is disposed on the support body 160. The cover portion 190 includes an insulator made of epoxy or the like and is supported by the support body 160. The support body 160 and the cover portion 190 define a hollow space 200 between the cover portion 190 and the piezoelectric layer 121. The hollow space 200 is a closed space and is isolated from a surrounding environment of the acoustic wave device 100A. Thus, when the surrounding environment of the acoustic wave device 100A changes, it is possible to reduce or prevent an influence thereof on the functional element 130.

Additionally, also in such a configuration in which the cover portion is provided, by forming the shape of each of the corner portion of the laminated film 120 and the portion of the electrode pad 140 facing the corner portion in a curved shape or a polygonal shape, it is possible to reduce or prevent peeling of the laminated film 120 and the electrode pad 140 which may occur when a thermal stress is applied.

Modification 2

Figure 7:
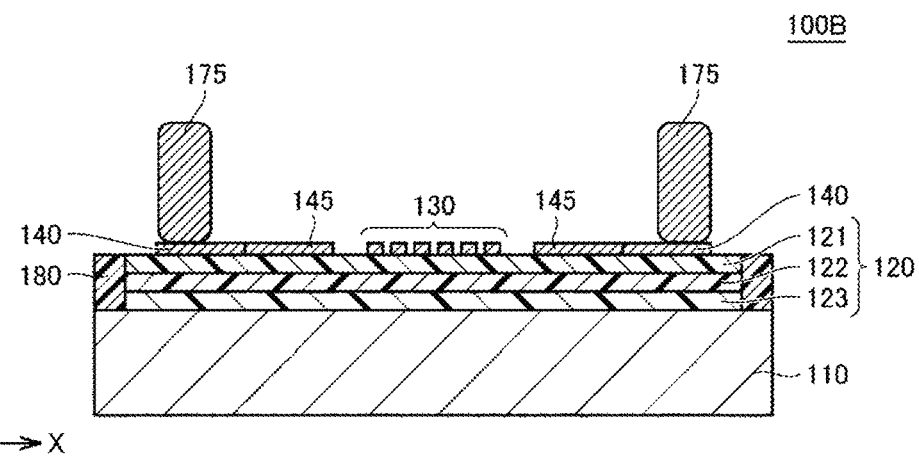
FIG. 7 is a sectional view of an acoustic wave device of Modification 2.

FIG. 7 is a sectional view of an acoustic wave device 100B of Modification 2. The acoustic wave device 100B of FIG. 7 is a so-called CSP component that can be surface-mounted on a circuit board or the like.

Referring to FIG. 7, the acoustic wave device 100B schematically has a configuration in which a portion including the support body 160, the connection electrode 150, and the solder bump 170 of the acoustic wave device 100 illustrated in FIG. 1 is replaced with an external connection terminal 175. In FIG. 7, the description of the same elements as those of the acoustic wave device 100 of FIG. 1 will not be repeated.

The external connection terminal 175 is a stud bump formed of, for example, a conductor made of gold (Au) or the like and is electrically connected to the electrode pad 140. Note that, as the material of the external connection terminal 175, a metal material other than Au may be used.

When mounted on a circuit board or the like, the external connection terminal 175 is connected to a terminal on the circuit board. After being mounted on the circuit board, a periphery of the acoustic wave device 100B is sealed with resin or the like, as necessary.

Also in such an acoustic wave device 100B formed as the CSP component, by forming the shape of each of the corner portion of the laminated film 120 and the portion of the electrode pad 140 facing the corner portion in a curved shape or a polygonal shape, it is possible to reduce or prevent peeling of the laminated film 120 and the electrode pad 140 which may occur when a thermal stress is applied.

Note that, in the above description, the case where the SAW resonator is used as the functional element has been described as an example, however, another acoustic wave device such as a bulk acoustic wave (BAW) resonator may be used as long as the functional element is disposed in the hollow space.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer on the support substrate;
   a functional element on the piezoelectric layer; and
   an electrode pad on the piezoelectric layer and connected to the functional element; wherein
   the support substrate and the piezoelectric layer each have a rectangular or substantially rectangular shape in plan view from a direction normal to the support substrate;
   at least one corner portion of the piezoelectric layer has a curved shape or a polygonal shape; and
   a portion of the electrode pad facing the at least one corner portion of the piezoelectric layer has a curved shape or a polygonal shape in plan view from the direction normal to the support substrate.

2. The acoustic wave device according to claim 1, wherein the piezoelectric layer is inside an outer periphery of the support substrate in plan view from the direction normal to the support substrate.

3. The acoustic wave device according to claim 2, further comprising:
   a resin layer provided between an outer shape of the support substrate and an outer shape of the piezoelectric layer in plan view from the direction normal to the support substrate.

4. The acoustic wave device according to claim 1, further comprising:
   an intermediate layer between the piezoelectric layer and the support substrate.

5. The acoustic wave device according to claim 4, wherein the intermediate layer includes a low acoustic velocity layer on the support substrate and through which a bulk acoustic wave propagates at an acoustic velocity lower than an acoustic velocity at which a bulk wave propagates through the piezoelectric layer.

* * * * *